(12) United States Patent
Cai

(10) Patent No.: US 11,307,467 B2
(45) Date of Patent: Apr. 19, 2022

(54) ELECTROSTATIC DISCHARGE CIRCUIT AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Zhenfei Cai, Shenzhen (CN)

( * ) Notice: Subject to any disclaimer, the term of this patent is extended or adjusted under 35 U.S.C. 154(b) by 255 days.

(21) Appl. No.: 16/619,669

(22) PCT Filed: May 22, 2019

(86) PCT No.: PCT/CN2019/087990
§ 371 (c)(1),
(2) Date: Dec. 5, 2019

(87) PCT Pub. No.: WO2020/211148
PCT Pub. Date: Oct. 22, 2020

(65) Prior Publication Data
US 2021/0325741 A1    Oct. 21, 2021

(30) Foreign Application Priority Data
Apr. 17, 2019 (CN) .......................... 201910309823.5

(51) Int. Cl.
*G02F 1/1362* (2006.01)
*H01L 27/12* (2006.01)

(52) U.S. Cl.
CPC ...... *G02F 1/136204* (2013.01); *H01L 27/124* (2013.01)

(58) Field of Classification Search
CPC ................................................. G02F 1/136204
See application file for complete search history.

(56) References Cited

U.S. PATENT DOCUMENTS

| 6,570,370 B2 * | 5/2003 | Tupper ............. H02M 7/53871 |
| | | 323/293 |
| 2007/0058098 A1 | 3/2007 | Lo et al. |
| 2014/0126093 A1 * | 5/2014 | Duan ................ G02F 1/136204 |
| | | 361/56 |
| 2015/0160522 A1 | 6/2015 | Wu et al. |
| 2016/0238911 A1 * | 8/2016 | Yoshii ............... G02F 1/136204 |
| 2018/0061825 A1 | 3/2018 | Hao et al. |

FOREIGN PATENT DOCUMENTS

| CN | 102655145 A | 9/2012 |
| CN | 102967973 A | 3/2013 |
| CN | 103944154 A | 7/2014 |
| CN | 106773410 A | 5/2017 |
| CN | 106909010 A | 6/2017 |
| CN | 108761940 | * 11/2018 ........... G02F 1/1362 |
| CN | 109031827 A | 12/2018 |

* cited by examiner

*Primary Examiner* — Sang V Nguyen
(74) *Attorney, Agent, or Firm* — JMB Davis Ben-David

(57) ABSTRACT

An electrostatic discharge circuit and a display panel. The electrostatic discharge circuit includes a first conductive path and a second conductive path. An input end of the first conductive path is connected to a data signal of the display panel, and an output end is connected to a first power voltage for releasing positive charge accumulated in the display panel. An input end of the second conductive path is connected to the data signal of the display panel, and an output end is connected to a second power voltage for releasing negative charges accumulated in the display panel.

16 Claims, 1 Drawing Sheet

ELECTROSTATIC DISCHARGE CIRCUIT AND DISPLAY PANEL

CROSS-REFERENCE TO RELATED APPLICATIONS

This application claims the priority of International Patent Application No. PCT/CN2019/087990, filed on May 22, 2019, which claims priority to Chinese Patent Application No. 201910309823.5, filed on Apr. 17, 2019. The entire disclosures of each of the above applications are incorporated herein by reference.

BACKGROUND OF INVENTION

Field of Invention

The present invention relates to the field of display technologies, and in particular, to an electrostatic discharge circuit and a display panel.

Description of Prior Art

In display panels, electrostatic discharge circuits are generally designed to release static electricity generated and accumulated during operation of circuits in the display panel to avoid breakdown of the circuit components after large-scale accumulation of static electricity which will make the display panel not work.

FIG. 1 is an electrostatic discharge circuit in the prior art, in which a ratio of a width to a length of a thin film transistor T is large, and a voltage of a data is usually small, ranges from 0 to 15V. Therefore, when the display panel is operating normally, the electrostatic discharge circuit is turned off. When a large amount of charge needs to be released is instantaneously generated in the display panel, the thin film transistor T is turned on, and the electrostatic discharge path is turned on.

Technical Problem

The electrostatic discharge circuit in the prior art can only release a large amount of accumulated positive charge. When negative charge is accumulated in a large amount, the electrostatic discharge circuit in the prior art cannot be turned on, and the display panel will still be broken down. Therefore, there is a need to improve the electrostatic discharge circuit in the prior art.

SUMMARY OF INVENTION

The present invention provides an electrostatic discharge circuit and a display panel, which can discharge both positive charge and negative charge accumulated during the operation of circuits in the display panel.

To solve the above problems, the present invention provides an electrostatic discharge circuit for a display panel, wherein the electrostatic discharge circuit comprises:

a first conductive path, wherein an input end of the first conductive path is connected to a data signal of the display panel, and an output end is connected to a first power voltage for releasing positive charge accumulated in the display panel;

a second conductive path, wherein an input end of the second conductive path is connected to the data signal of the display panel, and an output end is connected to a second power voltage for releasing negative charges accumulated in the display panel.

According to one aspect of the invention, wherein the first conductive path comprises a first thin film transistor, a first storage capacitor, and a second thin film transistor;

wherein a gate and a drain of the first thin film transistor are connected to the data signal of the display panel, and a source of the first thin film transistor is connected to one plate of the first storage capacitor;

a drain of the second thin film transistor is connected to the data signal of the display panel, a gate of the second thin film transistor is connected to the other plate of the first storage capacitor, and a source of the second thin film transistor is connected to the first power voltage.

According to one aspect of the invention, wherein a width to length ratio of the first thin film transistor is larger than a width to length ratio of the second thin film transistor.

According to one aspect of the invention, wherein the first thin film transistor has a width to length ratio of more than 50:8, and the second thin film transistor has a width to length ratio of less than 10:100.

According to one aspect of the invention, wherein the first thin film transistor and the second thin film transistor are N-type thin film transistors.

According to one aspect of the invention, wherein the second conductive path comprises a third thin film transistor, a second storage capacitor, and a fourth thin film transistor;

wherein a drain of the third thin film transistor is connected to the data signal of the display panel, a gate of the third thin film transistor is connected to one plate of the second storage capacitor, and a source of the third thin film transistor is connected to the second power voltage;

wherein a drain of the fourth thin film transistor is connected to the other plate of the second storage capacitor, and a gate and a source of the third thin film transistor are connected to the second power voltage.

According to one aspect of the invention, wherein a width to length ratio of the fourth thin film transistor is greater than a width to length ratio of the third thin film transistor.

According to one aspect of the invention, wherein the fourth thin film transistor has a width to length ratio greater than 50:8, and the third thin film transistor has a width to length ratio less than 10:100.

According to one aspect of the invention, wherein the third thin film transistor and the fourth thin film transistor are N-type thin film transistors.

The present invention further provides a display panel, wherein the display panel comprises an electrostatic discharge circuit, the electrostatic discharge circuit comprising:

a first conductive path, wherein an input end of the first conductive path is connected to a data signal of the display panel, and an output end is connected to a first power voltage for releasing positive charge accumulated in the display panel;

a second conductive path, wherein an input end of the second conductive path is connected to the data signal of the display panel, and an output end is connected to a second power voltage for releasing negative charges accumulated in the display panel.

According to one aspect of the invention, wherein the first conductive path comprises a first thin film transistor, a first storage capacitor, and a second thin film transistor;

wherein a gate and a drain of the first thin film transistor are connected to the data signal of the display panel, and a source of the first thin film transistor is connected to one plate of the first storage capacitor;

a drain of the second thin film transistor is connected to the data signal of the display panel, a gate of the second thin film transistor is connected to the other plate of the first storage capacitor, and a source of the second thin film transistor is connected to the first power voltage.

According to one aspect of the invention, wherein a width to length ratio of the first thin film transistor is larger than a width to length ratio of the second thin film transistor.

According to one aspect of the invention, wherein the first thin film transistor has a width to length ratio of more than 50:8, and the second thin film transistor has a width to length ratio of less than 10:100.

According to one aspect of the invention, wherein the first thin film transistor and the second thin film transistor are N-type thin film transistors.

According to one aspect of the invention, wherein the second conductive path comprises a third thin film transistor, a second storage capacitor, and a fourth thin film transistor;

wherein a drain of the third thin film transistor is connected to the data signal of the display panel, a gate of the third thin film transistor is connected to one plate of the second storage capacitor, and a source of the third thin film transistor is connected to the second power voltage;

wherein a drain of the fourth thin film transistor is connected to the other plate of the second storage capacitor, and a gate and a source of the third thin film transistor are connected to the second power voltage.

According to one aspect of the invention, wherein a width to length ratio of the fourth thin film transistor is greater than a width to length ratio of the third thin film transistor.

According to one aspect of the invention, wherein the fourth thin film transistor has a width to length ratio greater 50:8, and the third thin film transistor has a width to length ratio of less than 10:100.

According to one aspect of the invention, wherein the third thin film transistor and the fourth thin film transistor are N-type thin film transistors Beneficial Effects The electrostatic discharge circuit provided by the invention has two electrostatic discharge paths. A first conductive path is used for releasing positive charge accumulated in the display panel to the first power voltage, and a second conductive path is used for releasing negative charge accumulated in the display panel to a second power voltage. Therefore, the present invention can completely avoid the display panel being broken down due to static electricity accumulation in the display panel. In addition, storage capacitors for isolating the direct current (DC) signal are further disposed in the first conductive path and the second conductive path to ensure that the electrostatic discharge circuit is only turned on when receiving an alternating current (AC) voltage of a kilovolt level. Therefore, the present invention can eliminate the influence of the electrostatic discharge circuit during operation of the display panel.

DETAILED DESCRIPTION OF PREFERRED EMBODIMENTS

Figure 1:
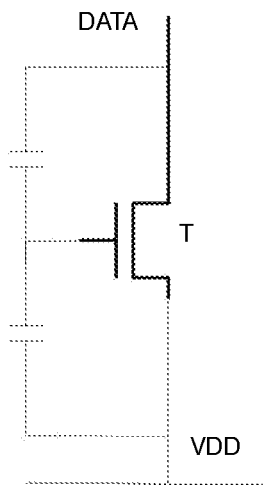
FIG. 1 is a circuit diagram of an electrostatic discharge circuit in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described.

Referring to FIG. 1, FIG. 1 is a circuit diagram of an electrostatic discharge circuit in the prior art, in which a ratio of a width and a length of a thin film transistor T is large, and a voltage of a data is usually small, ranges from 0 to 15V. Therefore, when the display panel is operating normally, the electrostatic discharge circuit is turned off. When a large amount of charge needs to be released is instantaneously generated in the display panel, the thin film transistor T is turned on, and the electrostatic discharge path is turned on. However, the electrostatic discharge circuit in the prior art can only release a large amount of accumulated positive charge. When negative charge is accumulated in a large amount, the electrostatic discharge circuit in FIG. 1 cannot be turned on, and the display panel will still break down.

To solve the above problems, the present invention provides an electrostatic discharge circuit for a display panel, which can discharge both positive charge and negative charge accumulated during the operation of circuits in the display panel.

Figure 2:
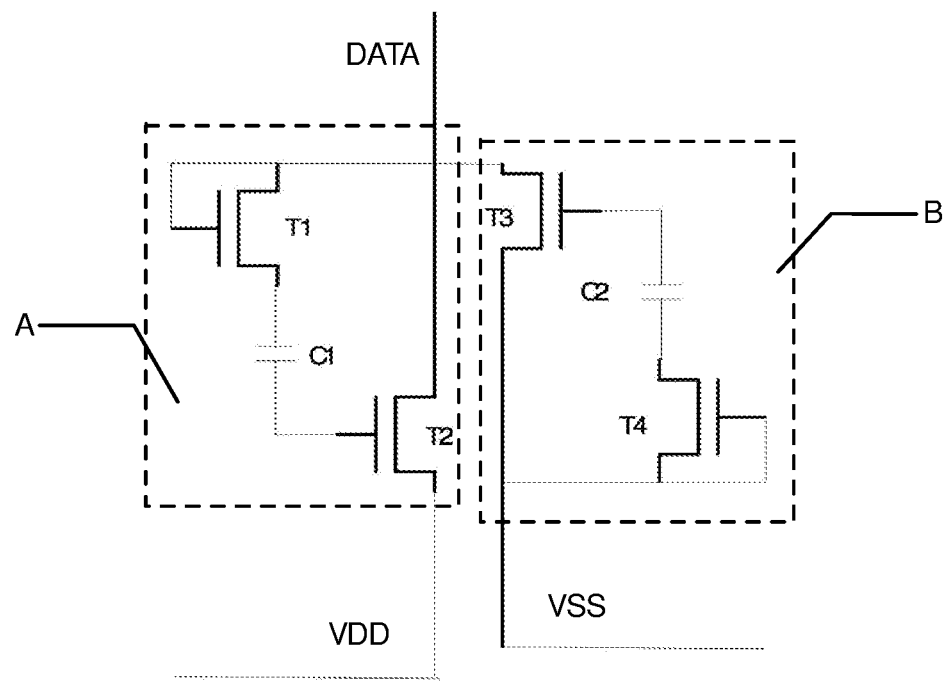
FIG. 2 is a circuit diagram of an electrostatic discharge circuit in an embodiment of the present invention.

Referring to FIG. 2, the present invention provides an electrostatic discharge circuit, comprising a first conductive path A and a second conductive path B.

An input end of the first conductive path A is connected to a data signal of the display panel, and an output end is connected to a first power voltage for releasing positive charge accumulated in the display panel. The first power voltage is a forward DC voltage, typically ranges from 15V and 30V. Because the thin film transistor in a pixel driving circuit in the display panel usually operates in a saturation region, the sudden rise of the first power voltage does not affect the operating state of the circuit of the display panel, that is, it does not affect the normal operating state of the display panel.

The first conductive path A comprises a first thin film transistor T1, a first storage capacitor C1, and a second thin film transistor T2. In the present embodiment, the first thin film transistor T1 and the second thin film transistor T2 are N-type thin film transistors.

Referring to FIG. 2, a gate and a drain of the first thin film transistor T1 are connected to the data signal of the display panel, and a source of the first thin film transistor T1 is connected to one plate of the first storage capacitor C1. A drain of the second thin film transistor T2 is connected to the data signal of the display panel, a gate of the second thin film transistor T2 is connected to the other plate of the first storage capacitor C1, and a source of the second thin film transistor T2 is connected to the first power voltage.

When a large positive voltage (usually kilovolts) accumulates on a data line of the display panel, because gate-source voltages of the third thin film transistor T3 and the fourth thin film transistor T4 in the second conductive path B are negative, they are still in a closed state. At this time, the gate-source voltage difference between the first thin film transistor T1 and the second thin film transistor T2 in the first conductive path A is in the order of kilovolts. The first conductive path A is completely turned on, and the static electricity is released into the signal line corresponding to the first power voltage.

In the present invention, a width to length ratio of the first thin film transistor T1 is larger than a width to length ratio of the second thin film transistor T2.

In the present embodiment, the first thin film transistor T1 has a width to length ratio of more than 50:8. When a large forward voltage is accumulated on the data line, the first thin film transistor T1 is turned on, and the gate voltage of the second thin film transistor T2 is raised by the first storage capacitor C1, so that the second thin film transistor T2 is turned on.

In the present embodiment, the second thin film transistor T2 has a width to length ratio of less than 10:100. Because the width to length ratio of the second thin film transistor T2 is relatively small, the corresponding cross-over voltage is also relatively large. Therefore, the electrostatic voltage is gradually consumed during the conduction process to achieve electrostatic discharge.

In the present invention, an input end of the second conductive path B is connected to the data signal of the display panel, and an output end is connected to a second power voltage for releasing negative charges accumulated in the display panel. The second power voltage is a negative DC voltage, typically a voltage of 0V. Since the second power voltage in the display panel is normally grounded, the instantaneous high voltage does not have any effect on the display panel.

The second conductive path B comprises a third thin film transistor T3, a second storage capacitor C2, and a fourth thin film transistor T4. In the present embodiment, the third thin film transistor T3 and the fourth thin film transistor T4 are N-type thin film transistors.

Referring to FIG. 2, a drain of the third thin film transistor T3 is connected to the data signal of the display panel, a gate of the third thin film transistor T3 is connected to one plate of the second storage capacitor C2, and a source of the third thin film transistor T3 is connected to the second power voltage. A drain of the fourth thin film transistor T4 is connected to the other plate of the second storage capacitor C2, and a gate and a source of the third thin film transistor T3 are connected to the second power voltage.

When a large negative voltage (usually kilovolts) is accumulated on a data line of the display panel, because gate-source voltages of the first thin film transistor T1 and the second thin film transistor T2 in the second conductive path A are negative, they are still in a closed state. At this time, the gate-source voltage difference between the third thin film transistor T3 and the fourth thin film transistor T4 in the first conductive path B is in the order of kilovolts. The first conductive path B is completely turned on, and the static electricity is released into the signal line corresponding to the second power voltage.

In the present invention, a width to length ratio of the fourth thin film transistor T4 is greater than a width to length ratio of the third thin film transistor T3.

According to one aspect of the invention, wherein the fourth thin film transistor T4 has a width to length ratio greater than 50:8, and the third thin film transistor T3 has a width to length ratio less than 10:100.

In the present embodiment, the fourth thin film transistor T4 has a width to length ratio of more than 50:8. When a large forward voltage is accumulated on the data line, the fourth thin film transistor T4 is turned on, and the gate voltage of the third thin film transistor T3 is raised by the first storage capacitor C1, so that the third thin film transistor T3 is turned on.

In the present embodiment, the third thin film transistor T3 has a width to length ratio of less than 10:100. Because the width to length ratio of the third thin film transistor T3 is relatively small, the corresponding cross-over voltage is also relatively large. Therefore, the electrostatic voltage is gradually consumed during the conduction process to achieve electrostatic discharge.

Accordingly, the present invention also provides a display panel comprising an electrostatic discharge circuit as described above.

The electrostatic discharge circuit provided by the invention has two electrostatic discharge paths. A first conductive path A is used for releasing positive charge accumulated in the display panel to the first power voltage, and a second conductive path B is used for releasing negative charge accumulated in the display panel to a second power voltage. Therefore, the present invention can completely avoid the display panel being broken down due to static electricity accumulation in the display panel. In addition, storage capacitors for isolating the direct current signal are further disposed in the first conductive path A and the second conductive path B to ensure that the electrostatic discharge circuit is only turned on when receiving an alternating voltage of a kilovolt level. Therefore, the present invention can eliminate the influence of the electrostatic discharge circuit during operation of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An electrostatic discharge circuit for a display panel, wherein the electrostatic discharge circuit comprises:
    a first conductive path, wherein an input end of the first conductive path is connected to a data signal of the display panel, and an output end is connected to a first power voltage for releasing positive charge accumulated in the display panel;
    a second conductive path, wherein an input end of the second conductive path is connected to the data signal of the display panel, and an output end is connected to a second power voltage for releasing negative charges accumulated in the display panel;
    wherein the first conductive path comprises a first thin film transistor, a first storage capacitor, and a second thin film transistor;
    a gate and a drain of the first thin film transistor are connected to the data signal of the display panel, and a source of the first thin film transistor is connected to one plate of the first storage capacitor; and
    a drain of the second thin film transistor is connected to the data signal of the display panel, a gate of the second thin film transistor is connected to the other plate of the first storage capacitor, and a source of the second thin film transistor is connected to the first power voltage.

2. The electrostatic discharge circuit according to claim 1, wherein a width to length ratio of the first thin film transistor is larger than a width to length ratio of the second thin film transistor.

3. The electrostatic discharge circuit according to claim 2, wherein the first thin film transistor has a width to length ratio of more than 50:8, and the second thin film transistor has a width to length ratio of less than 10:100.

4. The electrostatic discharge circuit according to claim 1, wherein the first thin film transistor and the second thin film transistor are N-type thin film transistors.

5. The electrostatic discharge circuit according to claim 1, wherein the second conductive path comprises a third thin film transistor, a second storage capacitor, and a fourth thin film transistor;
   wherein a drain of the third thin film transistor is connected to the data signal of the display panel, a gate of the third thin film transistor is connected to one plate of the second storage capacitor, and a source of the third thin film transistor is connected to the second power voltage;
   wherein a drain of the fourth thin film transistor is connected to the other plate of the second storage capacitor, and a gate and a source of the third thin film transistor are connected to the second power voltage.

6. The electrostatic discharge circuit according to claim 5, wherein a width to length ratio of the fourth thin film transistor is greater than a width to length ratio of the third thin film transistor.

7. The electrostatic discharge circuit according to claim 6, wherein the fourth thin film transistor has a width to length ratio greater than 50:8, and the third thin film transistor has a width to length ratio less than 10:100.

8. The electrostatic discharge circuit according to claim 5, wherein the third thin film transistor and the fourth thin film transistor are N-type thin film transistors.

9. A display panel, wherein the display panel comprises an electrostatic discharge circuit, the electrostatic discharge circuit comprising:
   a first conductive path, wherein an input end of the first conductive path is connected to a data signal of the display panel, and an output end is connected to a first power voltage for releasing positive charge accumulated in the display panel;
   a second conductive path, wherein an input end of the second conductive path is connected to the data signal of the display panel, and an output end is connected to a second power voltage for releasing negative charges accumulated in the display panel;
   wherein the first conductive path comprises a first thin film transistor, a first storage capacitor, and a second thin film transistor;
   a gate and a drain of the first thin film transistor are connected to the data signal of the display panel, and a source of the first thin film transistor is connected to one plate of the first storage capacitor; and
   a drain of the second thin film transistor is connected to the data signal of the display panel, a gate of the second thin film transistor is connected to the other plate of the first storage capacitor, and a source of the second thin film transistor is connected to the first power voltage.

10. The display panel according to claim 9, wherein a width to length ratio of the first thin film transistor is larger than a width to length ratio of the second thin film transistor.

11. The display panel according to claim 10, wherein the first thin film transistor has a width to length ratio of more than 50:8, and the second thin film transistor has a width to length ratio of less than 10:100.

12. The display panel according to claim 9, wherein the first thin film transistor and the second thin film transistor are N-type thin film transistors.

13. The display panel according to claim 9, wherein the second conductive path comprises a third thin film transistor, a second storage capacitor, and a fourth thin film transistor;
    wherein a drain of the third thin film transistor is connected to the data signal of the display panel, a gate of the third thin film transistor is connected to one plate of the second storage capacitor, and a source of the third thin film transistor is connected to the second power voltage;
    wherein a drain of the fourth thin film transistor is connected to the other plate of the second storage capacitor, and a gate and a source of the third thin film transistor are connected to the second power voltage.

14. The display panel according to claim 13, wherein a width to length ratio of the fourth thin film transistor is greater than a width to length ratio of the third thin film transistor.

15. The display panel according to claim 14, wherein the fourth thin film transistor has a width to length ratio greater 50:8, and the third thin film transistor has a width to length ratio of less than 10:100.

16. The display panel according to claim 13, wherein the third thin film transistor and the fourth thin film transistor are N-type thin film transistors.

* * * * *